(12) United States Patent
Arima et al.

(10) Patent No.: US 7,149,024 B2
(45) Date of Patent: Dec. 12, 2006

(54) OPTICAL MODULATOR MODULE

(75) Inventors: Hiroyuki Arima, Yokohama (JP);
Osamu Kagaya, Tokyo (JP);
Masanobu Okayasu, Yokohama (JP);
Tetsuya Kato, Hiratsuka (JP);
Michihide Sasada, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/130,415

(22) Filed: May 17, 2005

(65) Prior Publication Data

US 2005/0264862 A1 Dec. 1, 2005

(30) Foreign Application Priority Data

May 31, 2004 (JP) ............... 2004-160643

(51) Int. Cl.
*G02B 26/00* (2006.01)

(52) U.S. Cl. .................. 359/237; 359/238; 257/664

(58) Field of Classification Search ............... 359/245, 359/237, 238; 257/728, 664, 690
See application file for complete search history.

(56) References Cited

U.S. PATENT DOCUMENTS 5,602,672 A 2/1997 Ishimura et al.

6,437,899 B1 8/2002 Noda

FOREIGN PATENT DOCUMENTS

| EP | 1 484 630 A1 | 12/2004 |
|----|---|---|
| JP | 06-006150 | 1/1994 |
| JP | 09-090302 | 4/1997 |
| JP | 11-122189 | 4/1999 |
| JP | 2001-257412 | 9/2001 |
| JP | 2003-279907 | 10/2003 |

*Primary Examiner*—Timothy Thompson
*Assistant Examiner*—Jerry Fang
(74) *Attorney, Agent, or Firm*—McDermott Will & Emery LLP

(57) ABSTRACT

The present invention provides an optical modulator module comprising: a chip carrier; a semiconductor optical modulator for modulating light based on an electronic signal; a strip conductor electrically connected to the semiconductor optical modulator; a first resistor electrically connected to the semiconductor optical modulator; and a second resistor electrically connected in series to the first resistor; wherein the semiconductor optical modulator, the strip conductor, and the first and second resistors are disposed on the chip carrier; and wherein the frequency characteristics of the optical modulator module is adjusted by selecting to short or not to short both ends of the first resistor by use of a wire as necessary.

6 Claims, 6 Drawing Sheets

OPTICAL MODULATOR MODULE

CLAIM OF PRIORITY

The present application claims priority from Japanese patent application Ser. No. 2004-160643, filed on May 31, 2004, the content of which is hereby incorporated by reference into this application.

BACKGROUND OF THE INVENTION

The present invention relates to an optical modulator module with an optical modulator therein, and more particularly to an optical modulator module for use in transmitters for optical fiber communications.

Improvements have been made to the internal configuration of electroabsorption modulator integrated laser diode modules (EA modulator integrated LD modules) having an electroabsorption modulator integrated laser diode packaged therein in order to improve their frequency characteristics. FIG. 1 is a plan view of the chip carrier portion of the electroabsorption modulator integrated laser diode module shown in FIG. 1(b) of Japanese Patent Laid-Open No. 2001-257412.

Referring to FIG. 1, an electroabsorption modulator integrated laser diode 3 and a chip capacitor 4 are mounted on a chip carrier 10. The electroabsorption modulator integrated laser diode 3 is a semiconductor device in which a laser diode 2 and an electroabsorption modulator 1 are integrated. The electroabsorption modulator 1 is optically coupled to an optical system (not shown) for optical output. The laser diode 2 receives electric power through wires 14 and 15 connected to the chip capacitor 4. A strip conductor 5 is disposed on the chip carrier 10. One end of the strip conductor 5 is connected to a signal source 11 as an input end, while the other end is electrically connected to the electroabsorption modulator 1 through a wire 12. Further, an impedance matching resistor 7 is inserted in the middle portion of the strip conductor 5. The strip conductor 5, the chip carrier 10, and a grounding conductor 6 form a high frequency line. A terminating resistor 8 formed of a thin-film resistor is disposed on the termination side of the chip carrier 10. One terminal of the terminating resistor 8 is electrically connected to the electroabsorption modulator 1 through a wire 13, while the other terminal is connected to the ground metal on the back side of the chip carrier 10 through a via 9.

FIG. 2 shows an equivalent circuit of the chip carrier portion shown in FIG. 1. The signal source 11 is connected through a transmission line (not shown) to one end of a microstrip line 23 made up of the strip conductor 5 and the chip carrier 10. The microstrip line 23 also includes the resistance R7 of the impedance matching resistor 7. The inductance L12 of the wire 12 is connected to the other end of the microstrip line 23. Two branch lines are connected to the other end on the left side of the inductance L12. One includes the electroabsorption modulator 1 indicated by a diode in the figure, while the other branch includes the inductance L13 of the wire 13 and the resistance R8 of the terminating resistor 8 that are connected in series. These branch lines are each grounded at the other end.

Thus, the electroabsorption modulator integrated laser diode module described above is configured such that the wires 12 and 13 connect between the strip conductor 5 and the electroabsorption modulator 1 and between the electroabsorption modulator 1 and the terminating resistor 8, respectively, thereby improving the waveform of the optical output or eye pattern at a transmission rate of 10 Gbps (gigabits per second).

It should be noted that Japanese Patent Laid-Open No. 2003-279907 discloses an optical modulator exciting circuit comprising a modulator, a first strip line, and a second strip line, wherein: the first strip line outputs a modulation signal to the modulator through a first resistor; and the second strip line is connected to the first strip line through the modulator and formed of a second resistor and a third resistor connected in series.

Incidentally, the more types of electroabsorption modulators there are, the more widely their capacitances vary and hence the more widely the frequency characteristics of electroabsorption modulator integrated laser diode modules using these electroabsorption modulators vary. This may leads to an increase in the return loss and/or the transmission loss of an electroabsorption modulator integrated laser diode module.

In such a case, it is necessary to redesign the chip carrier portion so as to optimize the frequency characteristics of the electroabsorption modulator integrated laser diode module. However, this requires development time and expense, thus increasing the total cost.

SUMMARY OF THE INVENTION

An optical modulator module of the present invention is characterized in that at least one of the impedance matching resistor and the terminating resistor is formed of a plurality of resistor elements or resistors, and none or a selected one or ones of them are shorted by use of a gold wire(s) to provide a resistance value matching the capacitance of the optical modulator.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

There will now be described optical modulator modules according to preferred embodiments of the present invention with reference to the accompanying drawings.

Figure 3:
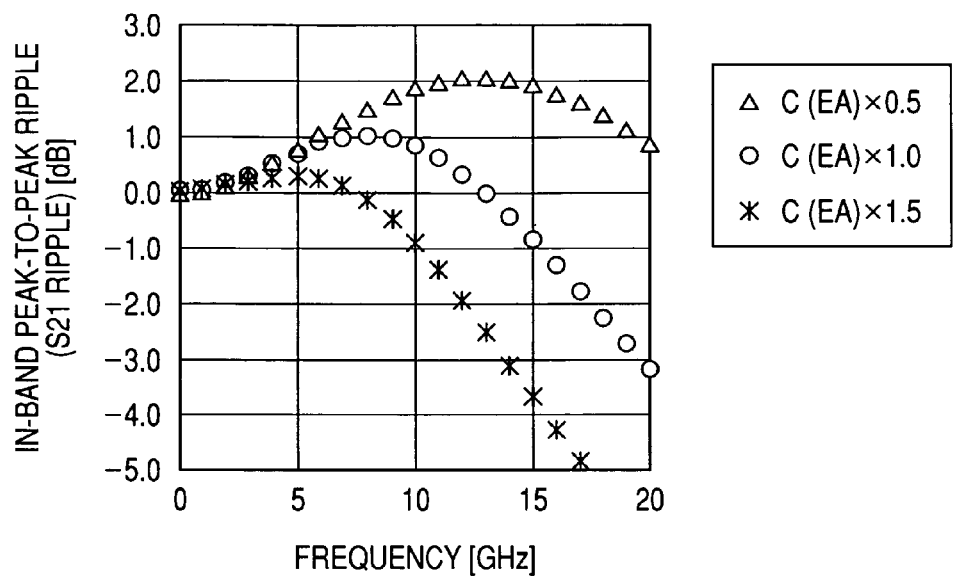
FIG. 3 is a diagram showing frequency dependence of the in-band peak-to-peak ripple or S21 ripple of an electroabsorption modulator integrated laser diode module obtained through a simulation in which the capacitance of the electroabsorption modulator was changed.
Figure 4:
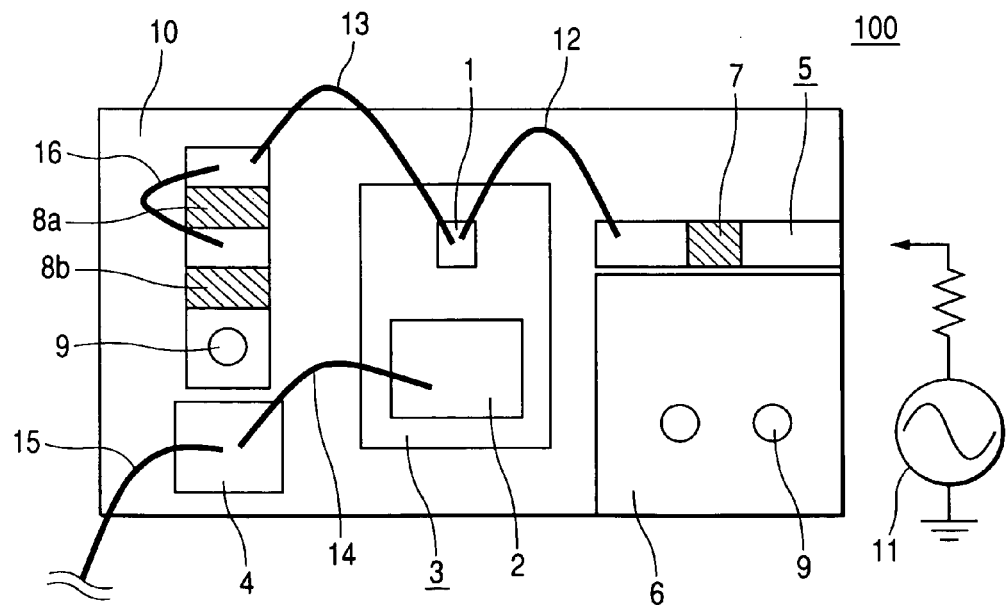
FIG. 4 is a plan view of the chip carrier portion of an electroabsorption modulator integrated laser diode module according to a first embodiment of the present invention.
Figure 5:
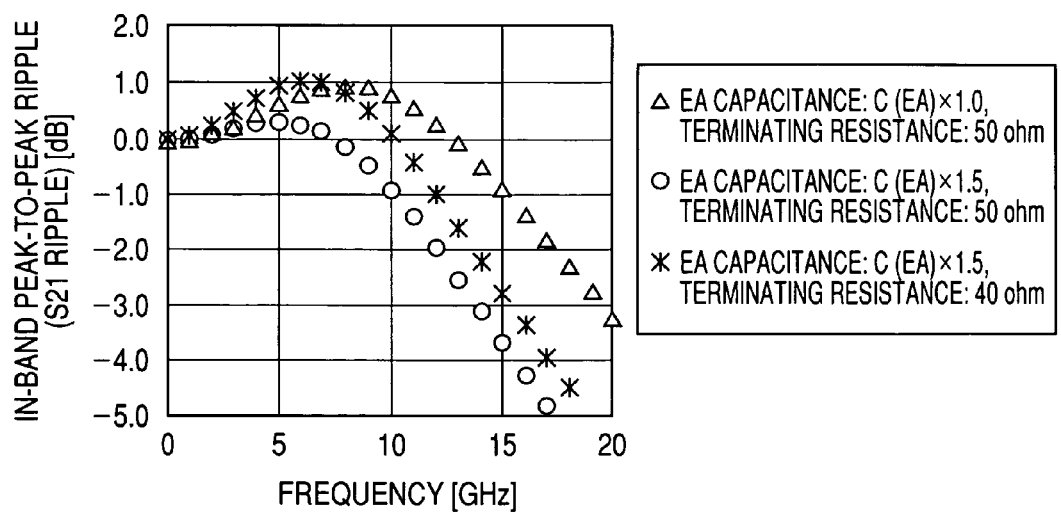
FIG. 5 is a diagram showing frequency dependence of the in-band peak-to-peak ripple of the electroabsorption modulator integrated laser diode module obtained through a simulation in which the capacitance of the electroabsorption modulator and the terminating resistance were changed.

A first embodiment of the present invention will be described with reference to FIGS. 3 and 5. FIG. 3 shows the results of a simulation of how the in-band peak-to-peak ripple of an electroabsorption modulator module changes with the capacitance of the electroabsorption modulator; FIG. 4 is a plan view of a substantial portion of an electroabsorption modulator integrated laser diode module according to the first embodiment; and FIG. 5 shows the results of a simulation of how the in-band peak-to-peak ripple of the electroabsorption modulator module changes as the capacitance of the electroabsorption modulator and the terminating resistance change.

With reference to FIG. 3, there will now be described how the in-band peak-to-peak ripple of an electroabsorption modulator integrated laser diode module changes with the capacitance of the electroabsorption modulator. It should be noted that the simulation was performed for the equivalent circuit shown in FIG. 2, and the impedance matching resistance and the terminating resistance were set to 0 Ω (ohm) and 50 Ω, respectively. It should be further noted that an in-band peak-to-peak ripple is a ratio of variations in optical output within a target band. The following evaluation was made based on in-band peak-to-peak ripple values at a frequency of 10 GHz. Since the optical modulator module of the present embodiment has a modulation rate of 10 Gbps, the simulation was performed so as to obtain in-band peak-to-peak ripple values at up to 20 GHz. The capacitance of the electroabsorption modulator was set to three values: 1.0 time a reference value, denoted by "C(EA)×1.0" in the figure; 0.5 times the reference value, denoted by "C(EA)× 0.5"; and 1.5 times the reference value, denoted by "C(EA)× 1.5". As can be seen from the figure, when the capacitance of the optical modulator was reduced to 0.5 times the reference value, the ripple increased in a positive direction, causing the waveform to exhibit ringing. When the capacitance of the optical modulator was increased to 1.5 times the reference value, on the other hand, the in-band peak-to-peak ripple changed in a negative direction.

With reference to FIG. 4, there will now be described the electroabsorption modulator integrated laser diode module of the present embodiment. An electroabsorption modulator integrated laser diode 3 is mounted on a chip carrier 10. A electroabsorption modulator 1 integrated in the electroabsorption modulator integrated laser diode 3 is optically coupled to an optical system (not shown) for optical output.

A strip conductor 5 is disposed on the chip carrier 10 such that they form a microstrip line. The strip conductor 5 includes an impedance matching resistor 7 between its input and output ends. The input end is disposed on the signal source 11 side, while the output end is connected to the electroabsorption modulator 1. A terminating resistor 8 formed of a thin-film material is disposed on the termination side of the chip carrier 10. The terminating resistor 8 is made up of a resistor or resistor element 8a and a resistor or resistor element 8b connected in series. One end of the terminating resistor 8 is connected to the electroabsorption modulator 1, while the other end is connected to the ground metal through a via 9. Gold wires 12 and 13 having a diameter of 25 μm (micrometer) connect between the electroabsorption modulator 1 and the strip conductor 5 and between the electroabsorption modulator 1 and the terminating resistor 8a, respectively.

A chip capacitor 4 and a grounding conductor 6 are also disposed on the chip carrier 10. A laser diode 2 constituting the electroabsorption modulator integrated laser diode 3 receives electric power through the chip capacitor 4 and gold wires 14 and 15. Further, the grounding conductor 6 is grounded through a plurality of vias 9 and therefore can be regarded as a portion of a high frequency line.

The resistance values of the terminating resistors 8a and 8b are 10 Ω (ohms) and 40 Ω, respectively. In the figure, both ends of the terminating resistor 8a are shorted by a gold wire 16 to select the terminating resistor 8b having a resistance value of 40 Ω. It goes without saying that resistance values of 50 Ω, 40 Ω, 10 Ω, and 0 Ω can be produced by shorting or not shorting either the resistor 8a or 8b or both by use of the gold wire 16.

With reference to FIG. 5, there will now be described the results of a simulation of how the in-band peak-to-peak ripple of the electroabsorption modulator module changes as the terminating resistance and the capacitance of the electroabsorption modulator change. Specifically, referring to FIG. 5, the capacitance of the electroabsorption modulator was set to 1.0 time a reference value or 1.5 times the reference value, and the terminating resistance was set to 50 Ω or 40 Ω.

As can be seen from the figure, when the capacitance of the electroabsorption modulator was increased from 1.0 time the reference value to 1.5 times the reference value with the terminating resistance set to 50 Ω, the in-band peak-to-peak ripple changed from +0.82 dB to −0.91 dB at 10 GHz, thus degrading the ripple characteristic. When the capacitance of the electroabsorption modulator was 1.5 times the reference value and the terminating resistance was 40 Ω, the in-band peak-to-peak ripple was +0.08 dB at 10 GHz, thus improving the characteristic. The above results indicate that the frequency characteristics of the electroabsorption modulator integrated laser diode module can be improved by adjusting the terminating resistance. Specifically, the in-band peak-to-peak ripple can be reduced to within a desired range even when the capacitance of the electroabsorption modulator increases or decreases by 50%.

Thus, the present embodiment can prevent the change in the in-band peak-to-peak ripple of an electroabsorption modulator module due to an increase in the capacitance of the electroabsorption modulator 1 by appropriately setting the value of the terminating resistance through wire bonding. That is, the present embodiment can provide a chip carrier portion capable of accommodating wide variations in the capacitances of optical modulators, allowing the optical modulator modules to have stable characteristics.

It should be noted that the impedance matching resistance may be set to 0 Ω. Any resistance or resistor descried in this specification can have a value of 0 Ω. Three or more terminating resistors may be connected in series, instead of two resistors, to widely or finely adjust the terminating resistance. Further, the electroabsorption modulator may not be integrated with the laser diode. Further, even though the above example employs an optical modulator of electroabsorption type, another type of optical modulator may be used. Still further, the present embodiment can be applied to Mach-Zehnder modulators, using $LiNbO_3$, or other optical modulators. The present embodiment is also not limited to high frequency lines of microstrip type. Other types of high frequency lines such as coplanar and grounded coplanar high frequency lines may be used. The above example employs thin-film resistors formed of tantalum nitride, which has a low temperature coefficient of resistance and maintains stable characteristics over many years. However, thin-film resistors of another material may be used. Further in the above example, the terminal areas of the terminating resistors and the strip conductor to which gold wires are connected are formed of gold. However, these terminal areas may be formed of another material. It should be noted that the above alternatives can also be used in other preferred embodiments described in this specification.

Figure 6:
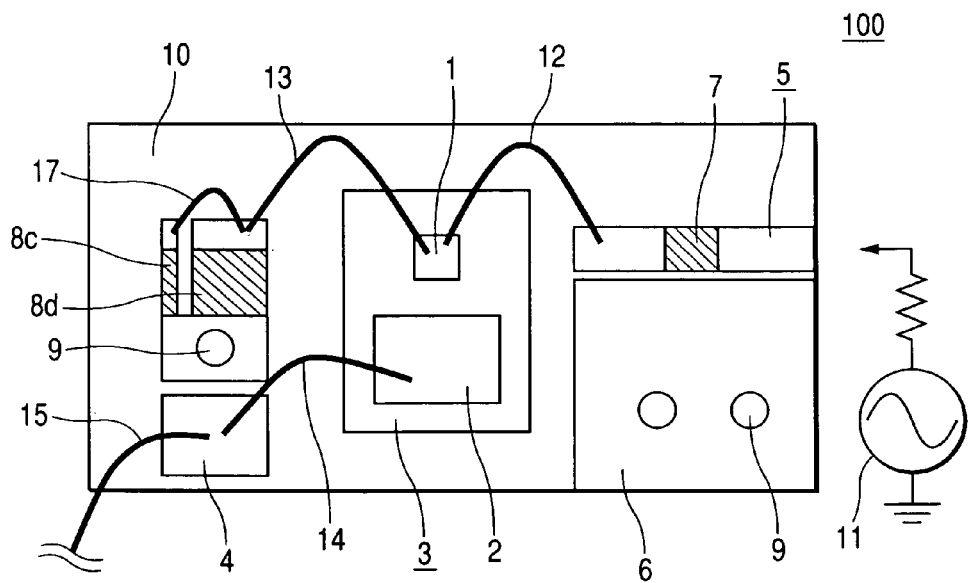
FIG. 6 is a plan view of the chip carrier portion of an electroabsorption modulator integrated laser diode module according to a second embodiment of the present invention.

A second embodiment of the present invention will be described with reference to FIG. 6. FIG. 6 is a plan view of a substantial portion of an electroabsorption modulator integrated laser diode module according to the second embodiment. It should be noted that the example in FIG. 6 includes components shown in FIG. 4, and description of these components will not be repeated below. As can be seen by comparison between FIGS. 4 and 6, in the present embodiment the terminating resistors 8c and 8d constituting the terminating resistance 8 are connected in parallel, whereas in the first embodiment the terminating resistors 8a and 8b are connected in series. In this example, the terminating resistor or resistor element 8c is 200 Ω and the terminating resistor or resistor element 8d is 50 Ω. It should be noted that the terminating resistors 8c and 8d are formed in the same process and hence have the same sheet resistance. For simplicity, the figure does not reflect the actual square number or the actual area of each resistor. The terminal common to the terminating resistors 8c and 8d is grounded through a via 9, whereas the other terminals of the terminating resistors 8c and 8d are connected to the electroabsorption modulator 1 by gold wires 13 and 17. As a result, the combined resistance of the terminating resistance 8 is 40 Ω. Therefore, the in-band peak-to-peak ripple can be reduced to within a desired range even when the capacitance of the electroabsorption modulator increases by 50%, as in the first embodiment.

Thus, the present embodiment can prevent the change in the in-band peak-to-peak ripple of an electroabsorption modulator module due to an increase in the capacitance of the electroabsorption modulator 1 by appropriating setting the value of the terminating resistance through wire bonding. That is, the present embodiment can provide a chip carrier portion capable of accommodating wide variations in the capacitances of optical modulators, allowing the optical modulator modules to have stable characteristics.

It should be noted that three or more terminating resistors may be connected in parallel, instead of two resistors, to widely or finely adjust the combined terminating resistance. For example, three terminating resistors of 50 Ω, 450 Ω, and 950 Ω may be used. In such a case, when the 50 Ω resistor and the 450 Ω resistor are connected to the optical modulator, the combined resistance is 45 Ω; when the 50 Ω resistor and the 950 Ω resistor are connected to the optical modulator, the combined resistance is 47.5 Ω; and when the 50 Ω resistor, the 450 Ω resistor, and the 950 Ω resistor are all connected to the optical modulator, the combined resistance is 43 Ω. That is, a total of 4 terminating resistance values can be achieved including the case where only the 50 Ω resistor is connected to the optical modulator. The 950 Ω resistor may be formed to have a meander structure and hence have the same sheet resistance.

Further, the common terminal for the parallel-connected resistors may be provided on the optical modulator side instead of on the ground side.

Figure 7:
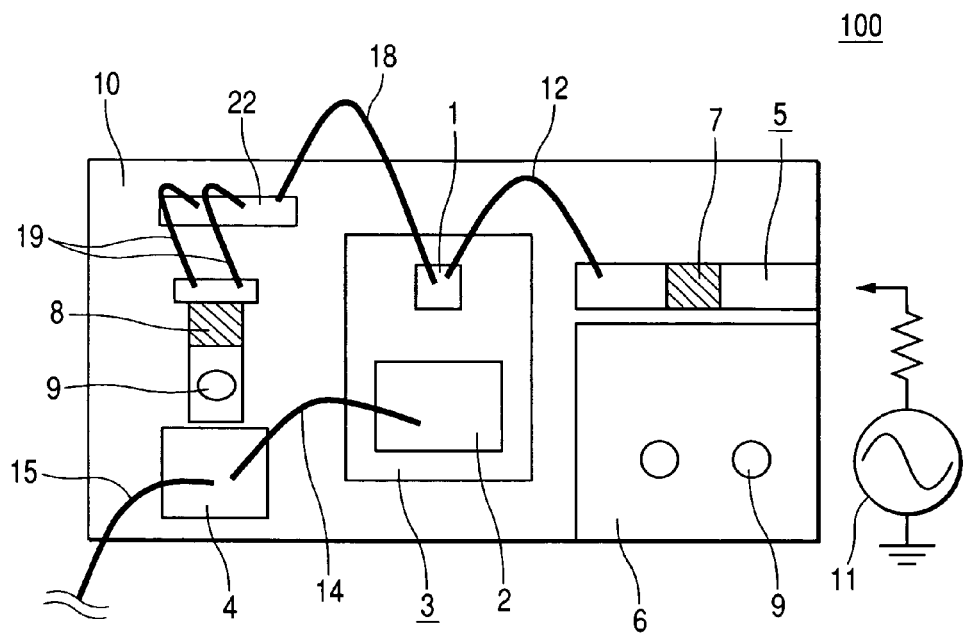
FIG. 7 is a plan view of the chip carrier portion of an electroabsorption modulator integrated laser diode module according to a third embodiment of the present invention.
Figure 8:
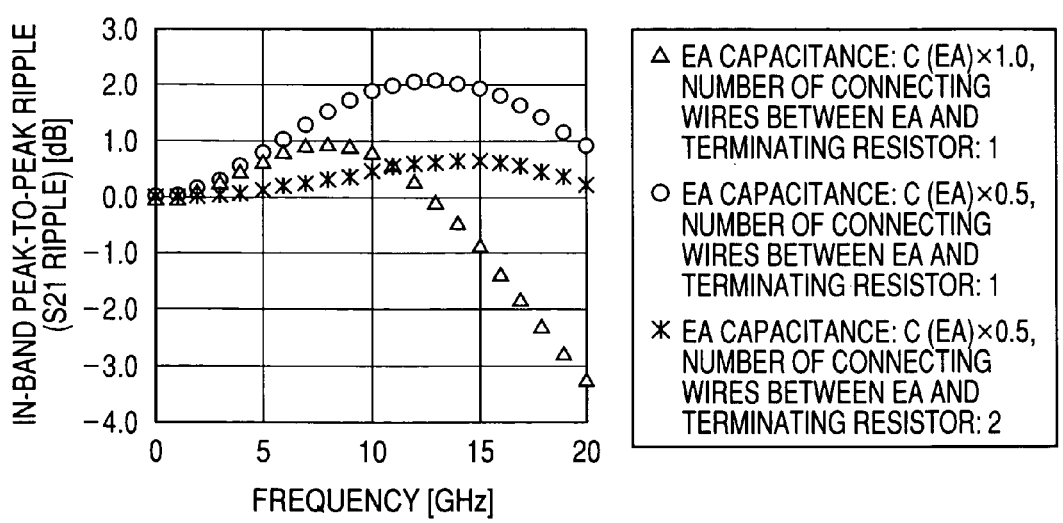
FIG. 8 is a diagram showing frequency dependence of the in-band peak-to-peak ripple of the electroabsorption modulator integrated laser diode module obtained through a simulation in which the capacitance of the electroabsorption modulator and the inductance connected to the terminating resistor were changed.

A third embodiment of the present invention will be described with reference to FIGS. 7 and 8. FIG. 7 is a plan view of a substantial portion of an electroabsorption modulator integrated laser diode module according to the third embodiment; and FIG. 8 shows the results of a simulation of how the in-band peak-to-peak ripple of the electroabsorption modulator module changes as the capacitance of the electroabsorption modulator and the inductance connected to the terminating resistor change. It should be noted that the example in FIG. 7 includes several components shown in FIG. 4, and description of these components will not be repeated below. As shown in FIG. 7, the present embodiment is configured such that: a wiring relay electrode 22 is provided between the electroabsorption modulator 1 and the 50 Ω terminating resistor 8; the electroabsorption modulator 1 and the wiring relay electrode 22 are connected to each other by a gold wire 18 having a diameter of 25 μm; and the wiring relay electrode 22 and the terminating resistor 8 are connected to each other by gold wires 19 having a diameter of 25 μm.

Figure 1:
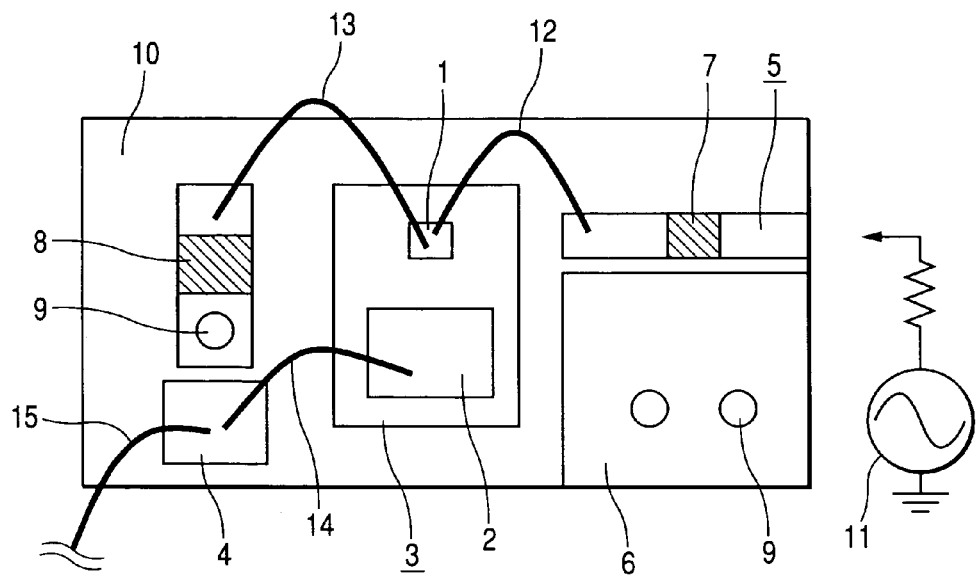
FIG. 1 is a plan view of the chip carrier portion of a conventional electroabsorption modulator integrated laser diode module.
Figure 2:
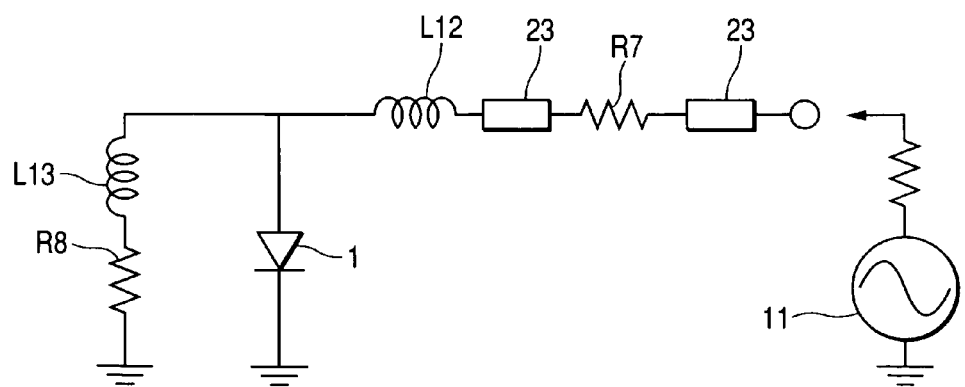
FIG. 2 is a diagram showing an equivalent circuit of the conventional electroabsorption modulator integrated laser diode module.

The two parallel-connected gold wires 19 connected to the terminating resistor 8 substitutes the inductance L13 shown in FIG. 2 with the two parallel-connected inductances. A simulation was performed under these conditions; FIG. 8 shows the results.

In the case of only a single wire being connected between the electroabsorption modulator and the terminating resistor, when the capacitance of the electroabsorption modulator was reduced from 1.0 time a reference value to 0.5 times the reference value, the in-band peak-to-peak ripple increased by approximately 1.0 dB, from +0.82 dB to +1.89 dB, at 10 GHz, causing the waveform to exhibit ringing, as in the example shown in FIG. 3. In the case of two wires being connected between the electroabsorption modulator and the terminating resistor, on the other hand, when the capacitance of the electroabsorption modulator was 0.5 times the reference value, the in-band peak-to-peak ripple was +0.46 dB at 10 GHz, indicating an improvement in the in-band peak-to-peak ripple characteristic. Specifically, the in-band peak-to-peak ripple can be reduced to within a desired range even when the capacitance of the electroabsorption modulator decreases by 50%.

Thus, the present embodiment can prevent the change in the in-band peak-to-peak ripple of an electroabsorption modulator module due to a reduction in the capacitance of the electroabsorption modulator 1 by changing the value of the inductance connected to the terminating resistor through wire bonding. That is, the present embodiment can provide a chip carrier portion capable of accommodating wide variations in the capacitances of optical modulators, allowing the optical modulator modules to have stable characteristics.

It should be noted that three or more wires may be connected between the electroabsorption modulator and the terminating resistor instead of two wires. Further, the present embodiment may be combined with the first or second embodiment. Still further, the wiring relay electrode may be omitted and the optical modulator and the terminating resistor may be directly connected to each other by two wires instead.

Figure 9:
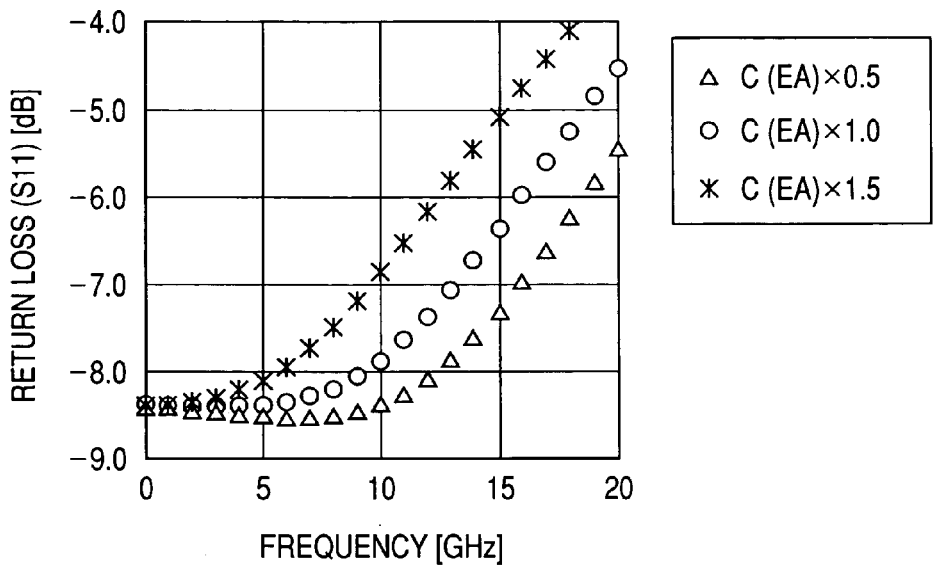
FIG. 9 is a diagram showing frequency dependence of the return loss of an electroabsorption modulator integrated laser diode module obtained through a simulation in which the capacitance of the electroabsorption modulator was changed.
Figure 10:
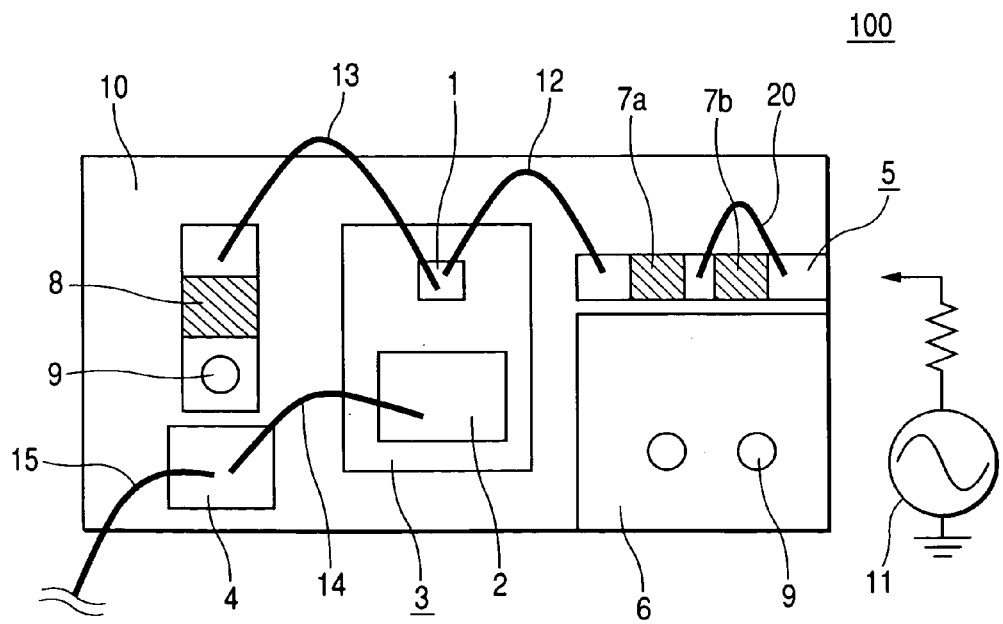
FIG. 10 is a plan view of the chip carrier portion of an electroabsorption modulator integrated laser diode module according to a fourth embodiment of the present invention.
Figure 11:
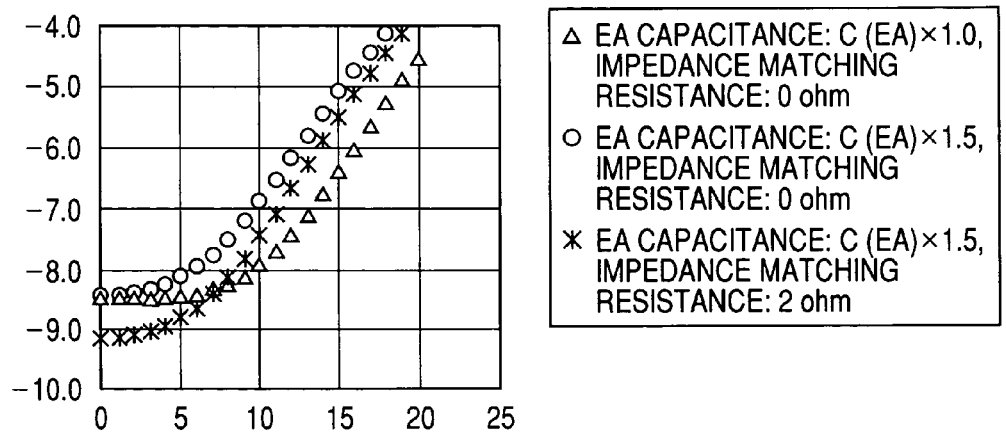
FIG. 11 is a diagram showing frequency dependence of the return loss of the electroabsorption modulator integrated laser diode module obtained through a simulation in which the capacitance of the electroabsorption modulator and the impedance matching resistance were changed.

A fourth embodiment of the present invention will be described with reference to FIGS. 9, 10, and 11. FIG. 9 shows the results of a simulation of how the return loss of an electroabsorption modulator module changes with the capacitance of the electroabsorption modulator; FIG. 10 is a plan view of a substantial portion of an electroabsorption modulator integrated laser diode module according to the present embodiment; and FIG. 11 shows the results of a simulation of how the return loss of an electroabsorption modulator module changes as the capacitance of the electroabsorption modulator and the impedance matching resistance change. It should be noted that the example in FIG. 10 includes several components shown in FIG. 4, and description of these components will not be repeated below.

With reference to FIG. 9, there will now be described how the return loss of an electroabsorption modulator module changes with the capacitance of the electroabsorption modulator. It should be noted that the simulation was performed for the equivalent circuit shown in FIG. 2, and the impedance matching resistance and the terminating resistance were set to 0 Ω and 50 Ω, respectively. Since the optical modulator module of the present embodiment has a modulation rate of 10 Gbps, the simulation was performed so as to obtain return loss values at up 20 GHz. The capacitance of the electroabsorption modulator was set to three values: 1.0 time a reference value, 0.5 times the reference value, and 1.5 times the reference value. As can be seen from the figure, the return loss increased with increasing capacitance of the electroabsorption modulator 1.

The fourth embodiment of the present invention will now be described. Referring to FIG. 10, a strip conductor 5 is disposed on a chip carrier 10 in an electroabsorption modulator integrated laser diode module 100 such that the strip conductor 5 and the chip carrier 10 form a microstrip line. The strip conductor 5 of the microstrip line includes series-connected impedance matching resistors or resistor elements 7a and 7b that are 2 Ω and 4 Ω, respectively. The impedance matching resistor 7b is shorted by a gold wire 20 having a diameter of 25 μm. That is, the combined impedance matching resistance 7 is 2 Ω. It goes without saying that resistance values of 6 Ω, 4 Ω, 2 Ω, and 0 Ω can be produced by shorting or not shorting either the resistor 7a or 7b or both by use of the gold wire 20.

FIG. 11 shows the results of a simulation of how the return loss of an electroabsorption modulator module changes as the impedance matching resistance and the capacitance of the electroabsorption modulator change. Referring to FIG. 10, the resistances of the impedance matching resistors 7a and 7b were set to 2 Ω and 4 Ω, respectively, and the capacitance of the electroabsorption modulator was set to two values: 1.0 time a reference value and 1.5 times the reference value. When both the 2 Ω impedance matching resistor 7a and the 4 Ω impedance matching resistor 7b were shorted, that is, the combined resistance was 0 Ω, and the capacitance of the electroabsorption modulator was increased from 1.0 time the reference value to 1.5 times the reference value, the return loss increased by approximately 1.0 dB, from −7.90 dB to −6.87 dB, at 10 GHz.

On the other hand, when the 2 Ω impedance matching resistor 7a was not shorted and the 4 Ω impedance matching resistor 7b was shorted, that is, the combined resistance was 2 Ω, and the capacitance of the electroabsorption modulator was 1.5 times the reference value, the return loss was −7.45 dB at 10 GHz. That is, the frequency characteristics of the electroabsorption modulator integrated laser diode was improved by adjusting the value of the impedance matching resistance. In FIG. 9, the return loss does not increase when the capacitance of the electroabsorption modulator is reduced by 50%. This means that the return loss can be reduced to within a desired range even when the capacitance of the electroabsorption modulator increases or decreases by 50%.

Thus, the present embodiment can prevent the increase in the return loss of an electroabsorption modulator module due to an increase in the capacitance of the electroabsorption modulator 1 by appropriately setting the value of the impedance matching resistance through wire bonding. That is, the present embodiment can provide a chip carrier portion capable of accommodating wide variations in the capacitances of optical modulators, allowing the optical modulator modules to have stable characteristics.

Figure 12:
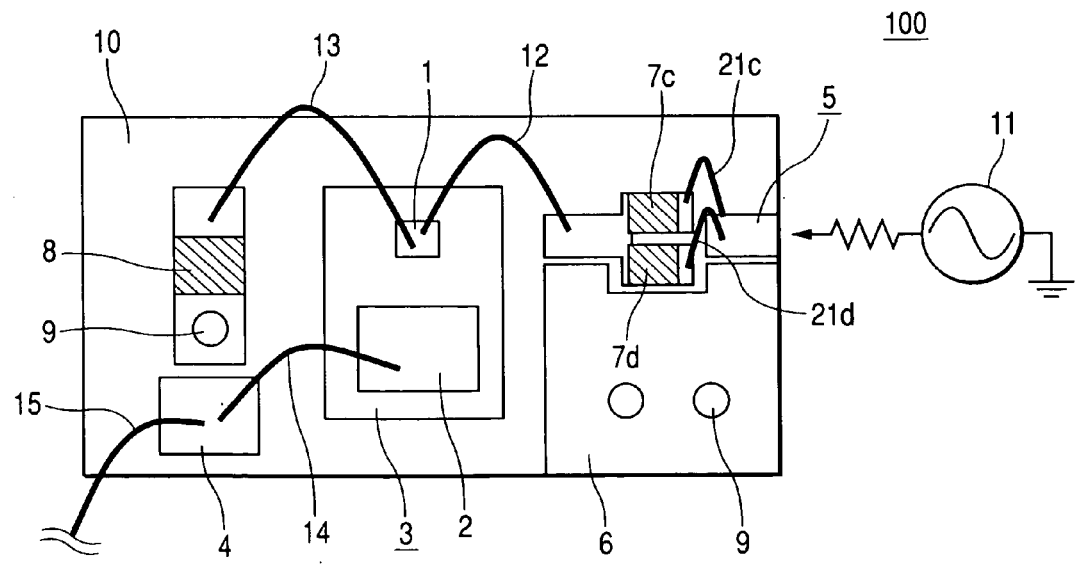
FIG. 12 is a plan view of the chip carrier portion of an electroabsorption modulator integrated laser diode module according to a fifth embodiment of the present invention.

A fifth embodiment of the present invention will be described with reference to FIG. 12. FIG. 12 is a plan view of a substantial portion of an electroabsorption modulator integrated laser diode module according to the fifth embodiment. It should be noted that the example in FIG. 12 includes several components shown in FIG. 4, and description of these components will not be repeated below.

As can be seen by comparison between FIGS. 12 and 10, in the present embodiment the impedance matching resistors 7c and 7d constituting the impedance matching resistance 7 are connected in parallel, whereas in the fourth embodiment the impedance matching resistors 7a and 7b are connected in series. In this example, the impedance matching resistor or resistor element 7c is 6 Ω and the impedance matching resistor or resistor element 7d is 4 Ω. It should be noted that the impedance matching resistors 7c and 7d are formed in the same process and hence have the same sheet resistance. For simplicity, the figure does not reflect the actual square number or the actual area of each resistor. The terminal common to both impedance matching resistors 7c and 7d is connected to the electroabsorption modulator 1 by a gold wire 12, while the other terminals of the impedance matching resistors 7c and 7d are connected to the strip conductor 5 on the signal input side by gold wires 21c and 21d. As a result, the combined resistance of the impedance matching resistance 7 is 2.4 Ω. Therefore, since the return loss does not increase when the capacitance of the electroabsorption modulator is reduced by 50%, the return loss can be reduced to within a desired range even when the capacitance of the electroabsorption modulator increases or decreases by 50%, as in the fourth embodiment.

Thus, the present embodiment can prevent the increase in the return loss of an electroabsorption modulator module due to an increase in the capacitance of the electroabsorption modulator 1 by appropriately setting the value of the impedance matching resistance through wire bonding. That is, the present embodiment can provide a chip carrier portion capable of accommodating wide variations in the capacitances of optical modulators, allowing the optical modulator modules to have stable characteristics.

It goes without saying that resistance values of 6 Ω, 4 Ω, 2.4 Ω, and 0 Ω can be produced by shorting or not shorting either the resistor 7c or 7d or both by use of the gold wire 21. It should be noted that the number of parallel-connected resistors may not be two. Further, the present embodiment may be combined with the fourth embodiment.

The present invention provides a chip carrier portion capable of accommodating optical modulators having different capacitances, allowing an optical modulator module to be quickly developed.

We claim:

1. An optical modulator module comprising:
   an optical modulator for receiving an electronic signal and modulating light;
   a high frequency line having two ends, one end being connected to an input terminal for receiving said electronic signal and the other end being connected to said optical modulator; and
   a resistor having two ends, one end being connected to said optical modulator and the other end being grounded;
   wherein said resistor is formed of a plurality of resistor elements and can be set to a desired combined resistance value by making a wire connection to said plurality of resistor elements; wherein:
   said plurality of resistor elements are connected in series; and
   said resistor can be set to said desired combined resistance value by shorting or not shorting a selected one or more of said plurality of resistor elements by use of a wire.

2. An optical modulator module comprising:
   an optical modulator for receiving an electronic signal and modulating light;
   a high frequency line having two ends, one end being connected to an input terminal for receiving said electronic signal and the other end being connected to said optical modulator; and
   a resistor having two ends, one end being connected to said optical modulator and the other end being grounded;
   wherein said resistor is formed of a plurality of resistor elements that are connected in parallel and share a common terminal;
   wherein one end of each of said plurality of resistor elements is connected to said common terminal; and
   wherein at least one of said plurality of resistor elements terminates a line for said electronic signal.

3. An optical modulator module comprising:
   an optical modulator for modulating light based on an electronic signal;
   a first resistor having two ends, one end being connected to an input terminal for receiving said electronic signal and the other end being connected to said optical modulator; and
   a second resistor having two ends, one end being connected to said optical modulator and the other end being grounded;
   wherein said first resistor includes a plurality of resistor elements and can be set to a desired combined resistance value by making a wire connection to said plurality of resistor elements; wherein:
   said plurality of resistor elements are connected in series; and
   said first resistor can be set to said desired combined resistance value by shorting or not shorting a selected one or more of said plurality of resistor elements by use of a wire.

4. An optical modulator module, comprising:
   an optical modulator for modulating light based on an electronic signal;
   a first resistor having two ends, one end being connected to an input terminal for receiving said electronic signal and the other end being connected to said optical modulator; and
   a second resistor having two ends, one end being connected to said optical modulator and the other end being grounded;
   wherein said first resistor includes a plurality of resistor elements and can be set to a desired combined resistance value by making a wire connection to said plurality of resistor elements; wherein:
   said plurality of resistor elements are connected in parallel and share a common terminal;
   each of said plurality of resistor elements has two ends, one end being connected to said common terminal; and
   said first resistor can be set to said desired combined resistance value by making a wire connection to the other end of a selected one or more of said plurality of resistor elements.

5. An optical modulator module comprising:
   an optical modulator for modulating light based on an electronic signal;
   a first resistor having two ends, one end being connected to an input terminal for receiving said electronic signal and the other end being connected to said optical modulator; and
   a second resistor having two ends, one end being connected to said optical modulator and the other end being grounded;
   wherein said optical modulator module further comprises:
   means for selecting a terminating resistance value such that the in-band peak-to-peak ripple or S21 ripple is −0.6 dB or more at 10 GHz, said terminating resistance value matching the capacitance of said optical modulator.

6. An optical modulator module comprising:
   an optical modulator for modulating light based on an electronic signal;
   a first resistor having two ends, one end being connected to an input terminal for receiving said electronic signal and the other end being connected to said optical modulator; and
   a second resistor having two ends, one end being connected to said optical modulator and the other end being grounded;
   wherein said optical modulator module further comprises:
   means for selecting an impedance matching resistance value such that the return loss is −7.4 dB or less at 10 GHz, said impedance matching resistance value matching the capacitance of said optical modulator.

* * * * *